Figure 4:
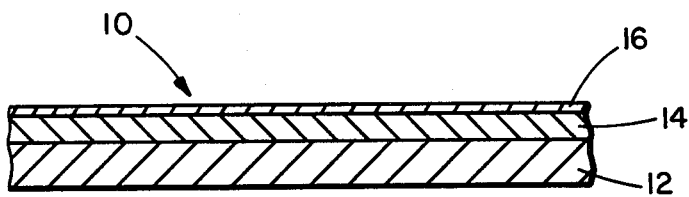

United States Patent [19]

Wacks et al.

[11] 4,138,262
[45] Feb. 6, 1979

[54] IMAGING FILM COMPRISING BISMUTH IMAGE-FORMING LAYER

[75] Inventors: Harvey H. Wacks; Masatsugu Izu, both of Birmingham; Donald J. Sarrach, Novi, all of Mich.

[73] Assignee: Energy Conversion Devices, Inc., Troy, Mich.

[21] Appl. No.: 724,993

[22] Filed: Sep. 20, 1976

[51] Int. Cl.$^2$ ............................ G03C 1/78; G03C 5/00
[52] U.S. Cl. ........................................ 96/87 R; 96/36; 96/38.3; 96/67; 96/86 P; 96/86 R; 156/634; 156/664; 427/250; 427/251
[58] Field of Search .................... 96/36, 67, 86 P, 38, 96/27 R, 38.3, 87 R; 156/634, 664, 656, 659; 204/15, 18; 427/250, 251

[56] References Cited
U.S. PATENT DOCUMENTS

| | | | |
|---|---|---|---|
| 3,262,825 | 7/1966 | Fuller | 156/664 |
| 3,317,409 | 5/1967 | Kaspaul | 96/1.5 |
| 3,393,070 | 7/1968 | Snelling | 96/1.5 X |
| 3,707,372 | 12/1972 | Hallman et al. | 96/36 |
| 3,925,079 | 12/1975 | Hager et al. | 96/38.1 |

Primary Examiner—Edward C. Kimlin
Attorney, Agent, or Firm—Wallenstein, Spangenberg, Hattis & Strampel

[57] ABSTRACT

An imaging film, and a method of making it, comprising a flexible plastic substrate having a thin, high optical density, continuous layer of bismuth, or an alloy of bismuth, deposited on a surface thereof. The bismuth layer has a roughened outer surface. To this roughened surface a layer of a photoactive material is applied which serves as a photoresist as well as a protective overlayer for the bismuth. The photoactive material may be positive or negative working. A layer of a developable photographic emulsion may be applied to the photoactive material layer to impart camera speed to the imaging film. The photoresist side of the film has a non-shiny, essentially non-reflecting black surface which resembles the appearance of developed silver halide films. The substrate side of the film, on the other hand, has a metallic appearance which is easily distinguishable from the photoresist side. This feature of the film enables an operator to readily ascertain the photoresist side of the film and speeds plate making.

8 Claims, 13 Drawing Figures

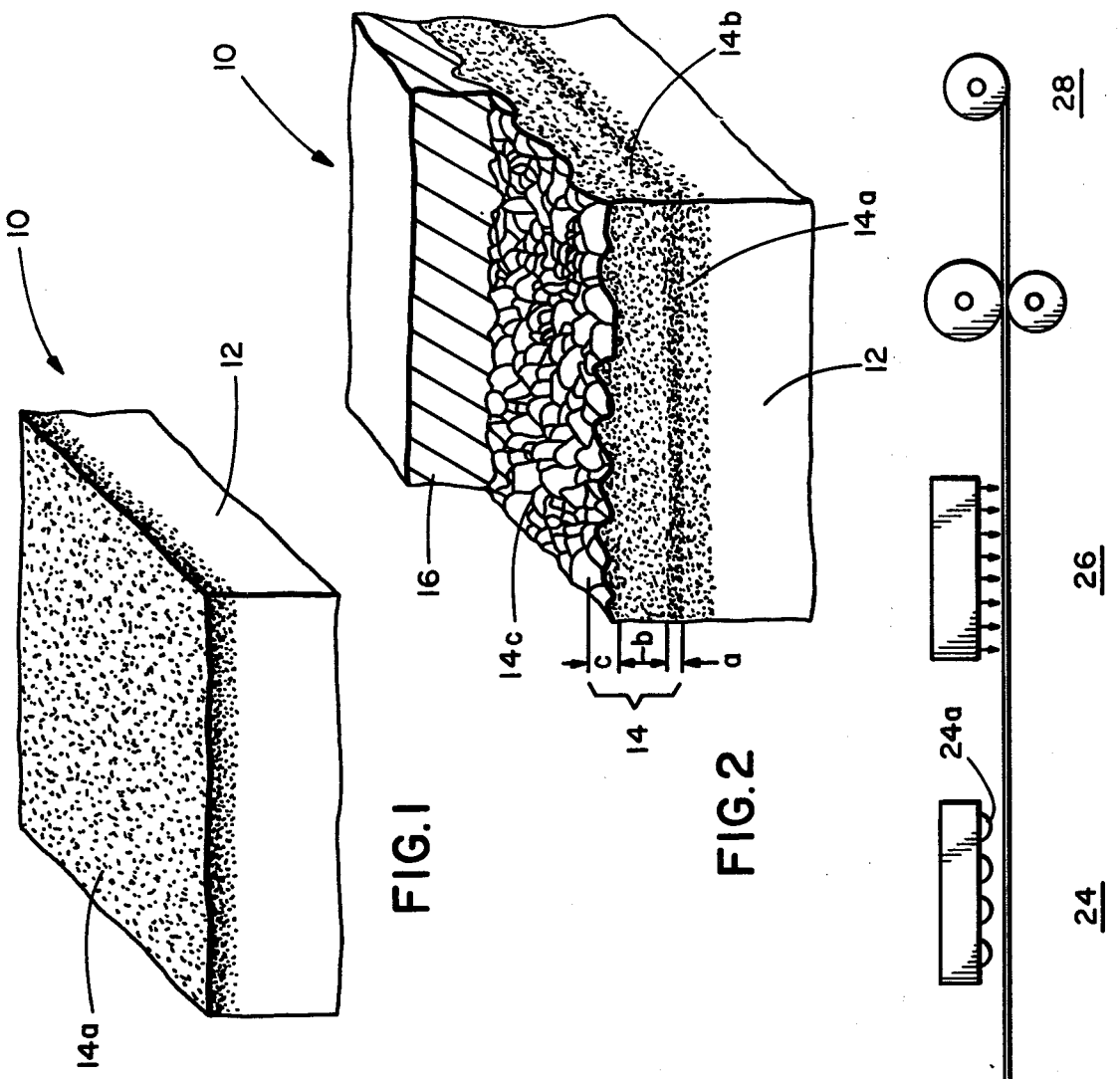
FIG.1
FIG.2
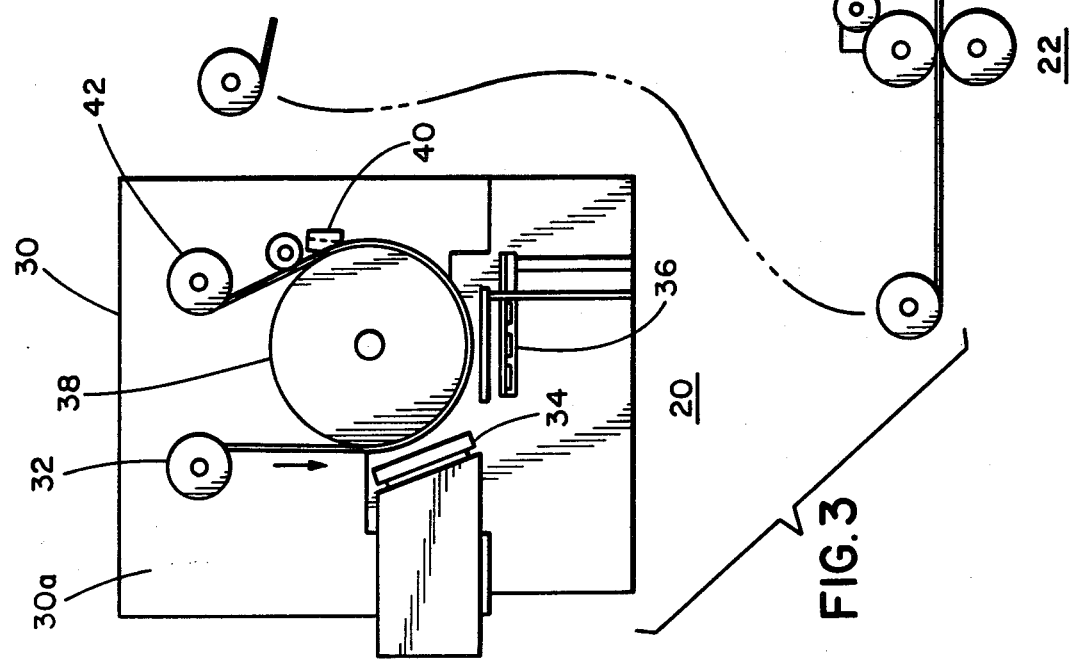
FIG.3

IMAGING FILM COMPRISING BISMUTH IMAGE-FORMING LAYER

The present invention relates to an imaging film, and to a method of making it, the film being especially useful in the graphic arts.

Perhaps the most widely used films in the graphic arts are silver halide emulsion films and diazo films.

Silver halide emulsion films, which are the most commonly used of the two, require a multiple step processing procedure which is both long and complicated, necessitating the use of a skilled operator. In addition, silver halide emulsion films are dependent upon the use of silver containing compounds. Silver already is in short supply, and reserves of the metal are being depleted at an alarming rate. This consideration, of course, has resulted, and, predictably, will continue to do so, in a substantial increase in the cost of silver, and, therefore, in the cost of such films. Another, although less frequently publicized, but widely recognized shortcoming of silver halide emulsion film, is that the developed films have the same black appearance on both the substrate and the emulsion side of the film. This creates a problem for even skilled operators because they cannot readily distinguish the substrate side from the emulsion side of the film.

In the case of diazo films, the development of such films is based upon the formation of a dye, and requires the use of aqueous or gaseous ammonia as the developer for the exposed film. Apart from its obnoxious properties, the use of such a developer requires special equipment to insure uniform distribution of ammonia vapor in the developing chamber, and to prevent the accumulation of any condensed ammonia vapors therein. Precautions, also, must be taken to prevent escape of ammonia vapors in the work area. Even then ammonia vapors are invariably sensed in the work area. Furthermore, diazo films cannot be dot-etched, and images produced on such films have low contrast. Over and above these considerations, diazo films presently commercially available, when developed, have a high minimum OD, usually about 0.4, for UV light having a wave length of 360 nm. This is because the decomposed diazo compounds still have strong absorption in the UV range. Therefore, the plate burning time required with such films is excessively long because commercially available plates utilize UV exposure.

In accordance with the present invention, an imaging film, and a method of making it, has been evolved which is uniquely different from imaging films heretofore employed in the graphic arts, not only from the standpoint of the end product obtainable from it, but, also, from the standpoint of its ability to be processed, dry-to-dry, after exposure, with simple, easy-to-use, non-obnoxious, aqueous, or essentially aqueous, etchants, in a single stage, or a multiple stage system, in less than one minute. The film of this invention is characterized by having an extremely high contrast and sharp edge acutance which is not obtainable with conventional graphic arts films such as silver halide emulsion films and diazo films. The resolution of the imaging film of the present invention is as high as 600 lines/mm, or about three times the resolution of silver halide emulsion films. The imaging film of this invention, moreover, has a gamma of approximately 20, or more, as compared to 10 for silver halide emulsion films, and 2 to 3 for diazo films. The film also has a constant maximum OD of 5, or greater, which is determined at the manufacturing stage of the film. Silver halide emulsion films and diazo films, on the other hand, have a maximum OD of the order of 3, which is variable, and which is determined in the processing stage. The minimum OD of the film of this invention is 0.02 and is constant. The minimum OD, also, is determined in the manufacturing stage of the film. Silver halide emulsion films and diazo films have a minimum OD of about 0.04 which, as in the case of the maximum OD of such films, is variable, and is determined at the development stage of the films. The minimum OD of diazo films is strongly dependent upon the wave length of the light used to measure the OD. The minimum OD increases from 0.04 to as high as 0.4 with a decrease in the wave length of from 500 nm to 360 nm. Also worthy of note is the fact that the exposure latitude of the film, as expressed in terms of log It, is twice that of silver halide emulsion films and diazo films, i.e., 0.6 log It as compared to 0.3 log It. The film, in addition, has excellent archival properties and excellent dimensional stability even under humid conditions. Crazing in the photoresist layer which results in defects in the imaged film, a problem not infrequently encountered with conventional metallized films having a metal-photoresist interface on a flexible substrate, is substantially nonexistent in the film of this invention due to the excellent bond formed between the photoresist and the roughened surface of the bismuth layer. Also, in marked contrast to conventional metallized films, the film of the present invention significantly reduces the undesirable reflection of incident radiation by the metallic layer both during exposure, and when the film is used as a master. The film, furthermore, has an easily distinguishable dark, or essentially non-reflective side, and a highly reflective or shiny side, which enables an operator to readily ascertain on which side of the film the photoactive material is located, and to visually inspect the image on the film more easily. The film can be used as a duplicating positive or negative film, and, in accordance with one embodiment of the invention, can be used as a camera speed photographic film. Dot etching of the film can be carried out without any concomitant through-dot density loss as occurs during dot etching with silver halide emulsion films, and this result can be achieved, moreover, with etchants which are inexpensive and safe to use, which are fast acting, yet easily controlled, and which eliminate the cumbersome mixing, storage, and handling problems which characterize the etchants employed in dot etching silver halide emulsion films. Over and above the foregoing advantages and outstanding properties of the film, the film of this invention does not employ a silver containing material as the final image forming material, and, therefore, can be manufactured at a cost which is substantially less than the cost of manufacturing silver halide emulsion films, and at a cost which is competitive with the cheaper diazo films.

In brief, the imaging film of the present invention comprises a flexible, transparent, plastic substrate having deposited on a surface thereof a thin, continuous, high optical density layer of bismuth, or an alloy of bismuth. The layer of bismuth is highly opaque, and initially has a dull, grayish appearance. The outer surface of the bismuth layer is roughened and is uniquely adapted to receive a photoactive material which functions both as a photoresist and as a protective overlayer for the bismuth. In this connection, it was unexpectedly discovered that, following the application of the photoactive material layer onto the bismuth layer, the photoactive material layer side of the film is black, non-shiny and substantially non-reflective, and, surprisingly, has the appearance of a silver halide emulsion film. It was also discovered that the roughened surface of the bismuth layer provides an excellent base for the photoactive material layer, and enables the formation of a bond between the two layers which substantially eliminates crazing in the photoactive material layer. This property of the film of this invention is essential for graphic arts applications where it is common to bend large sheets of film during processing. As indicated, the photoactive layer may be a negative working or a positive working material. In accordance with one aspect of the invention, the photoactive layer may be provided with a film of a photographic emulsion to impart camera speed to the entire structure.

The bismuth may be deposited on the substrate by any of various techniques, including vapor deposition, vacuum deposition, or sputtering. In accordance with the preferred method aspects of the invention, an initial layer of bismuth is deposited on the substrate by sputtering. A second or top layer of bismuth is then deposited on the first layer by evaporation. The sputtering and evaporation of the bismuth advantageously is carried out in-line, or successively, in a continuous operation in the same chamber. The technique of first sputtering a metal on a surface and then applying a layer of the same metal or a different metal onto the sputtered layer is disclosed in published Japanese Patent Application No. 47-101550. However, the application does not contain any teaching with regard to the use of bismuth for this purpose. While sputtering of an initial layer of bismuth onto the substrate is optional, the objectives of the present invention are most advantageously achieved by utilizing sputtering because the sputtered layer of bismuth provides better adhesion between the substrate and the bismuth layer with the result that the completed film is substantially free of defects such as pinholes and scratches which may arise during manufacture of the film.

The flexible plastic substrate employed in making the film of this invention desirably is transparent and advantageously is non-outgassable, that is, it should not emit gas, usually air or water vapor, under vacuum conditions, or give off any volatile materials. In addition, the substrate should be free of voids and free of surface irregularities which can give rise to pinholes in the final structure. Over and above the foregoing considerations, the film should have good dimensional stability, and to this end, biaxially oriented films are preferred. Exemplary of plastic substances having utility for the purposes of this invention are polyesters, particularly, polyethylene terephalates, polystyrenes, polyethylenes, polypropylenes, and the like. Especially preferred is a polyester film available under the trade designation MELINEX "O" 400 gauge (ICI United States, Inc.). This film is characterized by its exceptionally smooth surface, its clarity, its freedom from voids, and its excellent dimensional stability. The thickness of the substrate may range from 2 to 7 mils, with a thickness of 3 to 5 mils being preferred.

The bismuth employed in making the film of this invention should be of high purity, preferably commercial grade 99.99% pure bismuth. As mentioned above, and as described in greater detail hereinafter, the bismuth is preferably deposited on a surface of the substrate in two stages. In the first stage, the bismuth is deposited on the film in a manner to cause a portion, at least, of the bismuth to penetrate, or enter, the surface of the plastic substrate film. This initial layer of bismuth serves to provide nucleation centers for depositing additional bismuth on the substrate surface, and does not, therefore, have to be continuous or solid. The initial layer, in addition, serves to establish the preferential orientation of the bismuth atoms to provide a light absorbing or "black" bismuth layer. Generally speaking, the OD of the initial layer of bismuth will be in the range of from about 0.01 to about 0.05 and will have an average thickness of from about 5 to about 100 angstroms, usually from about 10 to 50 angstroms, with a thickness of about 35 angstroms being preferred.

The outermost layer of bismuth is vacuum evaporated on the initial layer in a manner to provide a roughened outer surface to the topmost layer. As the optical density increases, the degree of roughness of the deposited bismuth layer increases. The bismuth layer has a shiny, metallic appearance over the OD range of 3 or less, but over the OD range of 3.5 or more has a dull, non-shiny or non-metallic appearance. As implied above, the dull, non-shiny appearance of the film can be attained without the sputtered layer of bismuth. The thickness of the outermost layer can range from about 1500 angstroms to about 3500 angstroms, usually from about 1700 angstroms to about 2500. The preferred optical density of the total bismuth layer ranges from about 3.5 to about 7, with an OD of about 5 being especially desirable. As stated, alloys of bismuth may also be used. Specific examples of such alloys are those of bismuth with tin, bismuth with lead, bismuth with tin and lead, and the like.

In FIGS. 1 and 2 of the accompanying drawings, the imaging film, designated generally by reference numeral 10, of this invention is represented in greatly enlarged perspective views in the stages of its formation. It should be understood that the drawings are merely representations of the film to aid in the description of the invention, and that the film, and the layers of materials comprising it, may have a different form than shown depending upon the manufacturing techniques and materials used in making the film. In FIG. 1, the plastic substrate 12 is shown with the initial layer 14a of bismuth deposited on a surface thereof. A portion, at least, of the bismuth atoms have penetrated the outer surface of the substrate 12 and are embedded in the substrate. In FIG. 2, the initial, or interfacial, layer 14a of the bismuth is represented by the zoned area designated by the letter "a". Deposited on the layer 14a is an intermediate zone "b" of mostly randomly oriented bismuth crystals 14b. This intermediate zone can have a thickness ranging from about 1200 to 1800, usually about 1600, angstroms. The OD of this zone will range from about 3 to 4, more or less. As deposition of the bismuth progresses, zone "c" of columnar grains 14c, consisting of preferentially vertically oriented crystallites having domed tops, or caps, and deeply penetrating grain boundaries, are formed. This zone can have a thickness ranging from about 300 to 1800, preferably about 600, angstroms. The OD of the entire layer 14 of bismuth, as stated above, will preferably be about 5. The highly roughened surface formed by the columnar grains provides an excellent anchoring surface for the layer 16 of photosensitive or photoactive material. The resulting integrated structure substantially reduces the possibility of crazing in the layer 16.

The photoactive, or photosensitive, materials having utility in the preparation of the imaging film of this invention can be selected from a wide group. As indicated, the photoactive material acts not only as a photoresist for the imaging film, but, also, serves as a protective overlayer for the underlying, comparatively soft bismuth layer. To this end, it is desirable to select photoactive materials which have a hardness when measured on the Mohs scale of not less than about 3.5 and preferably not less than 4. The photoactive material further should have a spectral sensitivity over the wave length range of from about 300 to about 450 nanometers. The thickness of the photoactive material layer is somewhat variable. However, the generally optimum objectives of the invention are achieved with photoactive material layer thicknesses in the range of from about 0.5 to about 5 microns, with a range of about 1.5 to about 2 microns being preferred. As stated, both negative working and positive working photoactive materials may be used in making the film of this invention.

Typical examples of negative working photoactive materials which can be used for the purposes of this invention are certain diazo compounds, especially the high molecular weight condensation products of diazo compounds and formaldehyde exemplified by the condensation product of diphenylamine-4-diazonium salts and formaldehyde. Also useful as photoactive materials are organic solvent soluble diazo compounds which can be prepared by reacting the high molecular weight compounds mentioned above with organic compounds having phenolic hydroxy groups, phosphonic groups, phosphinic groups, carboxylic acid groups, sulfonic acid groups, or the like. Specific examples of such diazo compounds are disclosed in U.S. Pat. Nos. 3,510,307, 3,591,575 and 3,669,660. These photoactive compounds may be used alone or they may be present in admixture with other organic polymers such as polyvinylacetate.

Other useful, negative working photosensitive materials are synthetic organic polymers sensitized with organic azido compounds. Examples of such organic polymers are cyclized polyisoprene, polybutadiene, polyvinylpyrrolidone, polyacrylamide, copolymers of acrylic acid, and the like. Specific examples of organic azido compounds which can be used are 4,4'-diazochalcone, 2,6-di-(4'-azidobenzal)4-methylcyclohexanone, p-azidobenzophenone, 4,4'-diazidostilbene-2,2'-disulfonic acid, and the like.

Also useful as negative working photosensitive materials are photopolymerization systems which are well known in the art. A typical example of such a system is a composition containing a polymer having ethylenically unsaturated side chains and a photosensitizer such as benzoin or its derivatives.

Various negative working photosensitive materials useful in the practice of the invention are available commercially. Thus, for example, the high molecular weight, water soluble diazo resin made from paraformaldehyde and 4-diazodiphenylamine bisulfate sold under the designation "Diazo 4 L" (Fairmount Chemical Company) is suitable. In addition, the photopolymers comprising polyvinyl cinnamate sold under the designation KPR (Eastman Kodak) can be used, as can the product comprising low molecular weight polyisoprenes and an aromatic diazido compound sold under the designation KMER (Eastman Kodak).

Positive working photosensitive materials which can be used in the preparation of the structure of this invention, like the negative working materials, can be selected from a wide group. Exemplary of such a photosensitive material is an o-quinone diazide compound. Materials of this type are disclosed, for instance, in U.S. Pat. Nos. 3,210,239 and 3,046,120. Exemplary of another positive working material which can be used is the composition comprising 2,3,4-trihydroxybenzophenone-naphthoquinone-(1,2)-diazide-(2)-5-sulfonic acid ester and an m-cresol formaldehyde novolak resin. Examples of o-quinone diazide products particularly suitable are those sold commercially under the designations "AZ-1350" and "AZ 1350 J" (Shipley). These products can be modified to meet specific requirements as to solids content, viscosity, hardness, and the like, by mixing them together.

The properties of the photoactive, or photosensitive, material layer of the imaging film may be altered to meet specific requirements, especially with regard to the viscosity thereof, and the hardness of the final photoactive material layer. Various polymers, including polyvinyl acetate, polyvinyl chloride, phenolic resins, styrene resins, and the like, may be incorporated into the photoactive materials to alter the properties thereof as desired.

In FIG. 3 of the drawings, a preferred system for preparing the imaging film of the present invention is schematically represented. As shown, the system comprises a metallizing station 20, a photoactive material applying station 22, a first drying station 24, a second drying station 26 and a re-wind station 28. The metallizing station 20 includes an air-tight metallizing unit 30 having a chamber 30a in which is located a plastic substrate feed roller 32, a bismuth sputtering cathode 34, a bismuth evaporation element 36, a water cooled drum 38, a monitoring device 40 and a take-up roll 42.

A roll of a flexible plastic sheet material is initially positioned on the feed roller 32. If desired, the roll of plastic sheet material, prior to placing it on the chamber 30a, may be re-wound to free any trapped gases. The chamber 30a is maintained under a vacuum of the order of $10^{-6}$ Torr, and an inert gas, such as high purity argon, is introduced into the chamber 30a to develop a background pressure of about 5 to $10 \times 10^{-3}$ Torr.

As the flexible plastic sheet material feeds off the roller 32, it is moved past the bismuth sputtering cathode 34. The rate of feed is variable. The temperature of the sheet material as it passes the bismuth cathode 34 is maintained by the drum 38 at a temperature which is below the distortion temperature of the sheet material, but which is sufficiently high to thermally soften the sheet material to enable the high velocity bismuth atoms emitted by the bismuth cathode 34 to penetrate the surface of the sheet material. As stated hereinabove, only a very thin layer of bismuth is deposited on the sheet material at this stage in the processing of the film. The sputtered bismuth layer formed on the plastic sheet material provides the necessary strong bond or adhesion between the sheet material and the bismuth, and, further, provides nucleation sites or centers which act as a tie coat for the later deposited evaporated layer of bismuth. Also, as stated above, the sputtered layer of bismuth acts to establish the necessary preferential orientation of the bismuth atoms to provide a light absorbing bismuth layer on the film. The degree of penetration of the bismuth atoms into the plastic sheet material is variable. However, it preferably is of the order of several atom layers in thickness.

After the sheet material passes the sputtering cathode 34, it undergoes a drop in temperature, and is no longer in a thermally softened state. As the sheet material passes along the water-cooled drum, it enters a bismuth vapor cloud furnished by the evaporation element 36. The element 36 comprises a resistance heated carbon boat with slugs of commercial grade bismuth metal in a molten state. Condensation of the evaporated bismuth takes place on the sputtered bismuth interfacial layer with bismuth atoms. The temperature of the bismuth is maintained at a temperature which is sufficiently high to evaporate it to form a vapor cloud. In the system shown, the temperature at this point may exceed 500° C. As the vaporized bismuth condenses on the sputtered layer of bismuth, it is believed to attain a preferred columnar, vertical orientation as schematically represented in FIG. 2 of the drawings. Stated differently, the evaporated bismuth condenses on the sputtered layer of bismuth whose grain boundaries are believed to be a vertical pattern in preference to that of lateral growth.

After passing the evaporation element 36, the bismuth coated sheet material passes the monitoring device 40 which optically monitors the thickness of the bismuth layer. The coated sheet material is then rewound on the roller 42. Upon completion of the bismuth deposition, the chamber 30a is filled with dry nitrogen gas to a pressure of about 1 atmosphere. The unit 30 is then opened and the bismuth coated roll sheet material is removed. At this stage, the bismuth layer has a dull, grayish surface appearance. As the bismuth layer is exposed to the atmosphere, a thin film, or monolayer, of bismuth oxide forms on the exposed surfaces of the layer of bismuth. The formation of the oxide on the bismuth layer, among other things, enhances the dull, grayish appearance of the layer.

The bismuth coated sheet material is now ready to be coated with a layer of a photoactive material. As indicated, this may be a negative or a positive working material. Coating of the photoactive material on the bismuth layer advantageously can be achieved by means of a roller head schematically shown in the drawings at station 22. The roller coating apparatus desirably is controlled to meter a thin coating of the photoactive material onto the bismuth layer without causing damage to it.

Following application of the photoactive material to the bismuth layer at the station 22, the imaging film moves to the first drying station, station 24, where it is subjected to heat from a bank of infra-red lamps 24a. The film temperature at the station 24 is of the order of 100° C. The heat furnished by the lamps 24a acts to deeply penetrate the photoactive material layer to drive off some of the volatile agents in the layer thereby greatly reducing the possibility of entrapment of volatiles. The imaging film then passes through station 26 comprising a convection dryer which also maintains a film temperature of approximately 100° C. The rate of travel of the film through the stations 22, 24 and 26 is variable. Generally speaking, however, the rate of travel will range between 20 to 100 feet per minute. The dried film is then cooled to approximately room temperature and rewound at station 28. In accordance with the preferred practice of the invention, glassine paper may be interleafed during the rewinding of the dried imaging film. The operations performed at the stations 22, 24, 26 and 28 advantageously are carried out under substantially dust-free conditions. After this coating operation, the film surface has a black, non-shiny, non-metallic appearance which resembles that of silver halide emulsion films.

Figure 13:
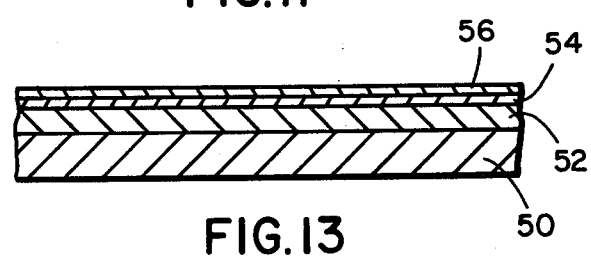

As indicated at the outset, the imaging film of the present invention can be processed to impart photographic, or camera speed capabilities to it. An embodiment of such an imaging film is illustrated in FIG. 13 of the drawings. As shown, the film comprises a substrate 50 having thereon a layer of bismuth 52 applied in the manner described above. A photoactive material 54 is applied to the uppermost layer of bismuth, and this layer, in turn, has an overlayer 56 of a silver halide emulsion thereon. Conventional silver halide emulsions may be used for this purpose. However, it is preferred to use a photographic emulsion capable of developing an optical density greater than 1, and which is capable of being removed by simple procedures which do not adversely affect the photoactive material layer 54 or the subsequent development of that layer. Silver halide emulsion systems containing an internal developer satisfy these needs. The thickness of the photographic emulsion layer is somewhat variable. However, in accordance with the preferred embodiment of the invention, the thickness of this layer is desirably in the range of from about 1 to 5 microns, usually from about 2 to 3 microns. It should be noted that the amount of silver halide required for the present invention is much less than that used in a conventional silver halide graphic arts film.

In utilizing this form of the invention, the film is exposed imagewise to actinic radiation sufficient to sensitize the silver halide emulsion. The image formed in the emulsion layer is then developed. The resulting image is then used to imagewise expose the photoactive layer 54. Thereafter, the image formed in the silver halide emulsion layer is removed, and the film is developed to provide an image in the bismuth layer.

Figure 5:
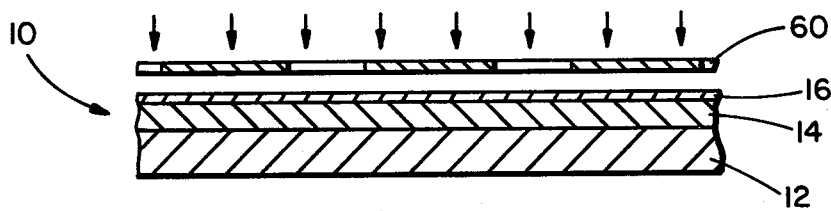
Figure 6:
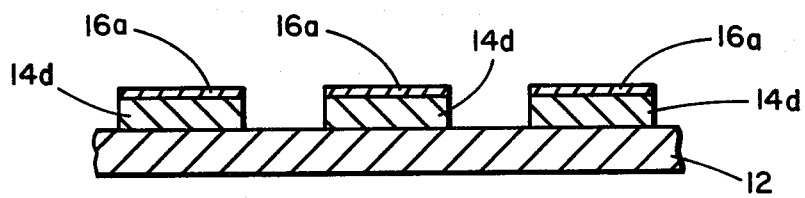
Figure 7:
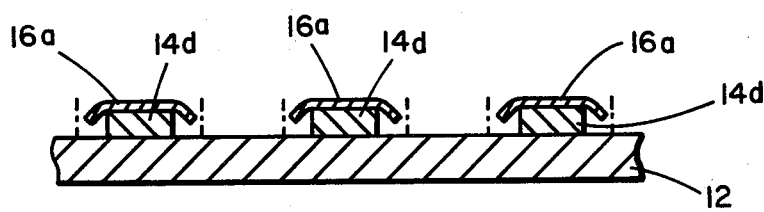
Figures 8, 9:
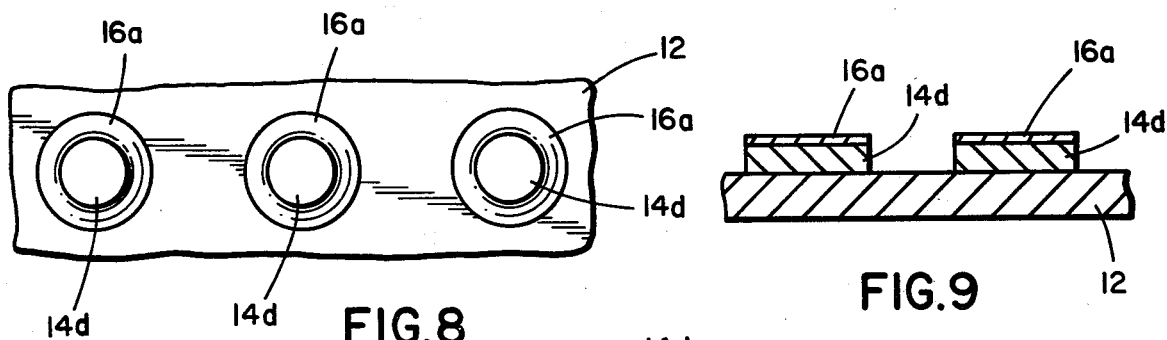

In FIGS. 4 through 11 of the drawings, the imaging film of the present invention is shown being dot-etched. The film, illustrated in FIG. 4 is shown in FIG. 5 being exposed through a mask 60 to actinic radiation to form a latent image in the photoactive material layer 16 which, for purposes of illustration, is a positive working photoresist. In the developed film shown in FIG. 6, the substrate 12 and the photoactive material coating 16a over each of the bismuth dots 14d are etch insoluble and etch impermeable. Thus, while permitting lateral attack by the etch on the dots to affect area reduction in size of the dots, the substrate 12 and the photoactive material coating 16a cooperate to substantially block any direct contact by the etch with the inner face and the outer face of the dots 14d, thereby preventing any through-dot optical density losses. The result of this cooperative action between the substrate 12 and the coating or cover 16a on each of the bismuth dots 14d in preserving through-dot optical density while enabling area reduction in size to be attained with an etch is best represented in FIGS. 7 and 8 of the drawings. As shown, the dots 14d, comprising the halftone dot image of FIG. 6, have undergone an appreciable lateral reduction in size along a horizontal plane parallel to the inner face and the outer face of the dots, but no reduction in size along an axial plane perpendicular to said faces. Thus, the through-dot optical density 14d remains essentially unchanged after etching. In addition, the dots, due to the non-granular character of the halftone dot-forming material, provide a much sharper definition than can be obtained with the silver halftone dots of conventional silver halide films. This feature of the dots, coupled with their uniform hardness, makes halftone positives, for example, made from the film of this invention superior to halftone positives prepared from silver halide films for deep etch lithographic plate making.

Figure 10:
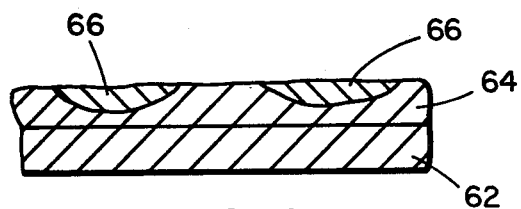
Figure 11:
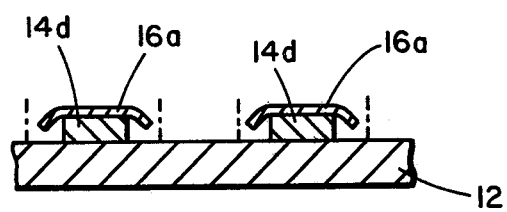
Figure 12:
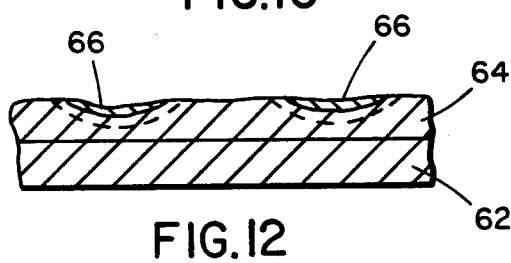

In FIGS. 9 through 12 of the drawings, a comparison is represented at halftone dots formed on the film of the present invention and the halftone dots formed on a conventional silver halide emulsion film. FIGS. 9 and 11 represent the halftone dots on the film of this invention before and after etching. FIG. 10 represents a conventional silver halide film comprising a substrate 62 having a layer of gelatin 64 thereon in which is distributed imagewise a plurality of halftone dots 66 formed of silver granules. FIG. 12 shows the same film after etching.

As illustrated in FIG. 11 each of the dots 14a of the film 10 of this invention has undergone an area reduction in size without any concomitant through-dot optical density loss. In FIG. 12, the silver dots 66 of the silver halide film, after etching, have undergone full-dot attack by the etch, resulting not only in total area reduction of the dot, but, also, a concomitant through-dot optical density loss. The ability of the etch to attack the entire halftone dot of conventional silver halide films invariably results in through-dot optical density losses which adversely affect the opacity of the halftone dot formation.

The invention will be further illustrated by, but is not intended to be limited to, the following examples:

EXAMPLE I

A 1200 ft. roll of an outgassed polyester film (ICI "Melinex O," 400 gauge) was placed in the chamber of a metallizing unit containing a radio frequency sputtering cathode comprising a 17.5 × 8 × 0.25 inch thick bismuth plate case directly on and bonded to a water cooled backing plate, and an evaporation source comprising a single carbon resistance boat with dimensions of 15 × 1 × 0.25 inches containing 13 individual cavities measuring 1 × 0.75 × 0.5 inch, each cavity having a 16 grams preweighed bismuth pellet in it. A water cooled drum was provided in the chamber. The chamber was maintained under a vacuum of $10^{-6}$ Torr. High purity argon gas was introduced into the chamber to provide a background pressure of $5 \times 10^{-3}$ Torr. The polyester film was fed at a speed of approximately 20 feet per minute passed the bismuth sputtering cathode while maintaining the temperature of the film at 100° C. The forward power of the cathode was 400 watts while its reflected power was 40 watts. While maintaining the same rate of feed, the film is passed in a water-cooled drum through a bismuth vapor cloud emanating from the resistance boat which is heated to a temperature of 624° C. The bismuth coated film is rewound on a take-up roll in the chamber. Dry nitrogen gas is introduced into the chamber to 1 atmosphere, after which the roll of bismuth coated film is removed. The bismuth layer on the film was about 2600 angstroms thick and had an OD of greater than 5.

A solution of a quinone diazide type photoresist comprising a 50–50 mixture of Shipley's AZ 1350J and AZ-1375 positive photoresists, having a solids content of 35% and a viscosity of 80 centipoises, was applied to the bismuth coated film to a wet thickness of about 6 microns, at a web speed of 45 feet per minute, utilizing an offset gravure roller coater. The photoresist coated film was then passed, at the same web speed, through a flow out zone, an infra-red lamp drying zone and a convection drying zone, the latter two zones being maintained at a temperature to provide a film temperature of 100° C. The application of the photoresist layer, and the drying of the layer were carried out under dust-free conditions.

The finished imaging film had a black, non-shiny finish on the photoresist side, and a shiny, highly reflective appearance on the substrate side.

The crazing properties of the imaging film were tested by cutting a 35 mm strip, 12 inches long from the roll, and attaching a 500 grams load to an end thereof. The thusly loaded strip was passed over a mandrel, of a given diameter, first in a downward direction and then upwardly. The unexposed film was then run through a standard etching solution two times, and examined with optical microscopy for material failure. If breaks or cracks developed in the photoresist materials, the etching solution would penetrate the film to the substrate. Any such breaks or cracks would be observed in transmitted light as a series of parallel lines perpendicular to the direction of travel of the film over the mandrel. No crazing was exhibited by the imaging film.

EXAMPLE II

A strip of the film prepared as in Example I was exposed for 20 seconds through a contact mask with UV light from an A-9 Colight Printer. The exposed film was processed through a 4-bath Interco-Op Copying Machine, Model DD 1437 (Agfa-Gevaert). The first bath contained 1000 ml. of a 2% aqueous KOH solution; the second bath contained 1000 ml. of water; the third bath contained 1000 ml. of a solution of 12% $FeCl_3$ and 1% citric acid in water; the fourth bath contained 1000 ml. of water.

The photoresist and the underlying bismuth layer of the exposed portions of the film were completely removed, and a positive duplicate of the mask was obtained. The processing time, dry-to-dry, was 35 seconds.

EXAMPLE III

A strip of the imaging film prepared as described in Example I was exposed for 20 seconds through an Ealing High Resolution Target using an A-9 Colight Printer as a UV source. The exposed film was processed by first immersing it for 45 seconds in a tray containing a 1 wt. % aqueous KOH solution, rinsing with water, immersing in a tray containing a solution of 6 wt. % $FeCl_3$ in water for about 2 minutes, and then rinsing with water. A positive duplicate of the resolution target was obtained. Microscopic examination of the developed film at 400x showed a resolution of 500 lines per mm.

EXAMPLE IV

A layer of bismuth is applied to a clear, smooth, dust-free film of polypropylene by means of the metallizing process described in Example I.

A water soluble diazo compound (Diazo 4L, Fairmont Chemical) was modified to provide an organic soluble diazo resin as follows: To a solution of 60g of Diazo 4L in 1.4 liters of water, a solution of 58g of the sodium salt of 1-diazo-2-naphthol-4-sulfonic acid in 400 ml of water was added slowly. A yellow precipitate became dark brown. After 30 minutes of stirring the solution, the precipitated material was separated by filtration and washed several times in order to remove any water soluble material. After drying, the material became a dark brown and brittle resinous material weighing 60 grams. This material was slightly soluble in methyl-cellosolve and highly soluble in DMF, N, N- dimethyl acetamide, and N-methyl-pyrrolidone, but insoluble in water.

Seventy grams of the modified Diazo resin was dissolved in 300 ml DMF and filtered (Solution I). 120 grams Vinac B-7, poly (vinyl acetate) resin (Air Products and Chemicals), was dissolved in 300 ml DMF and filtered (Solution II). A coating solution (III) was prepared from 1 part of I and 1 part of II.

The bismuth coated film was coated with the coating solution (III) to give a dried thickness of 1 micron. The photoresist side of the film was black and non-shiny, whereas the substrate side of the film was shiny and metallic. The film was exposed through a mask for 40 seconds with an A-9 Colight Printer. The exposed film was then processed with an Interco-Op Copying Machine, model DD 1437, charged as follows:

| Bath #1 | 500 ml of water and 500 ml of diacetin |
|---|---|
| Bath #2 | 1000 ml of water |
| Bath #3 | 1000 ml of a solution of 12% Fe Cl$_3$ and 1% citric acid in water |
| Bath #4 | 1000 ml of water |

A negative duplicate of the mask was obtained.

EXAMPLE V

The procedure described in Example IV was followed except that the exposed film was developed in a single, or common, solvent system comprising a solution containing 100 grams of FeCl$_3$, 300 ml of diacetin, and 800 ml of water. The solution was swabbed onto the exposed film until the image developed. The film was then washed with water and dried. A negative duplicate of the mask was obtained.

EXAMPLE VI

A film prepared as described in Example I is contact exposed, using a Xenon flash lamp, through a silver halide halftone negative produced by direct exposure using a 3-stop system with a 100-line halftone screen. The exposed film is processed by first immersing it for 45 seconds in a tray containing a 1 wt. % aqueous KOH solution, rinsing with water, immersing in a tray containing a solution of 6 wt. % of FeCl$_3$ in water for about 2 minutes, and then rinsing with water. A halftone positive comprising halftone dots formed of bismuth, each of the dots having a coating or protective overlayer of the non-exposed resist material, is obtained. The halftone positive is then immersed in an etch bath containing 250 ml of a 6% aqueous solution of FeCl$_3$. The film is removed from the etch bath after 3 minutes, rinsed and dried. A photomicrograph of the dots shows an approximate 75% reduction in size with no corresponding loss in through-dot optical density. The resist cover on the dots is in tack and remains transparent. The dots are hard, and the positive is usable for deep etch plate making.

What is claimed is:

1. A method of making an imaging film for use in the graphic arts comprising: providing a flexible, non-outgassing, transparent plastic sheet material having a thickness of from about 2 to 7 mils and being substantially free of voids and surface irregularities, sputtering a layer of bismuth, or bismuth alloy, about 5 to about 100 angstroms in thickness on a surface of the substrate to cause at least a portion of the bismuth, or bismuth alloy, to become embedded in said surface of the substrate, depositing by evaporation a further layer of bismuth, or a bismuth alloy, on the sputtered layer thereof, to provide a combined, continuous layer of bismuth, or bismuth alloy, on said surface of the substrate of from about 1500 to 3500 angstroms in thickness, said combined layer of bismuth, or bismuth alloy, being characterized in that it is opaque and is the image forming layer of the imaging film, and has a roughened outer surface, a dull, grayish, metallic appearance and an optical density of about 3.5 to about 7, and applying a layer of a photosensitive, latent image forming organic material on the roughened outer surface of the bismuth, or bismuth alloy, layer to convert the dull, grayish, metallic appearance of the bismuth, or bismuth alloy, layer to a black, non-reflective condition, said layer of photosensitive material being about 0.5 to about 5 microns in thickness and having a hardness of not less than 3.5 on the Mohs scale, said photosensitive material being characterized in that it acts as a photoresist for the imaging film and as a protective coating for the bismuth, or bismuth alloy, comprising the image forming layer of the film and is capable upon the application of radiant energy thereto of changing between two states, one of which is a state in which the energy sensitive material is substantially soluble with respect to a given solvent, and the other being a state in which the energy sensitive material is substantially insoluble with respect to said solvent, thereby enabling a latent image corresponding to a preselected pattern to be formed therein, said imaging film having a substrate side which is shiny and metallic in appearance and a photosensitive material side which is black and substantially non-reflective in appearance thereby enabling the photosensitive material side of the film to be readily distinguished from the substrate side of the film, said imaging film being characterized in that is has a resolution of the order of 600 lines/mm and a gamma of about 20, or more, and a constant maximum optical density of about 5 and a constant minimum optical density of about 0.02.

2. A method according to claim 1 wherein the plastic sheet material is heated to a temperature below its distortion temperature to soften it to enable a portion at least of the sputtered bismuth, or bismuth alloy, to penetrate the surface of said sheet material.

3. A method according to claim 1 wherein the sputtering of the bismuth, or bismuth alloy, and the vapor deposition thereof occur successively while the sheet material is in continuous motion.

4. A method according to claim 1 wherein the bismuth, or bismuth alloy, layers are deposited on the sheet material in an inert gaseous atmosphere.

5. A method according to claim 1 wherein the layer of photosensitive material is subjected to heat in two stages to remove volatiles.

6. A method according to claim 5 wherein the first of said two stages comprises infra-red radiation and the second stage is carried out with a heated air dryer.

7. A method according to claim 1 wherein the outer surface of the second bismuth, or bismuth alloy, layer is exposed to oxygen to form a coating of bismuth oxide on the surface of said second layer.

8. A method according to claim 1 wherein a layer of a photographic emulsion is applied to the photosensitive material layer, the emulsion having a thickness such that it will have an optical density of at least 1 when developed.

* * * * *